(12) United States Patent
Jiang et al.

(10) Patent No.: US 11,641,789 B2
(45) Date of Patent: May 2, 2023

(54) MEMORY CELLS AND METHODS FOR FORMING MEMORY CELLS

(71) Applicant: GLOBALFOUNDRIES Singapore Pte. Ltd., Singapore (SG)

(72) Inventors: Yi Jiang, Singapore (SG); Benfu Lin, Singapore (SG); Lup San Leong, Singapore (SG); Curtis Chun-I Hsieh, Singapore (SG); Wanbing Yi, Singapore (SG); Juan Boon Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 155 days.

(21) Appl. No.: 17/355,260

(22) Filed: Jun. 23, 2021

(65) Prior Publication Data

US 2022/0416160 A1   Dec. 29, 2022

(51) Int. Cl.
  *H10N 70/00* (2023.01)
  *H01L 45/00* (2006.01)
  *H01L 27/24* (2006.01)

(52) U.S. Cl.
  CPC ...... *H01L 45/1273* (2013.01); *H01L 27/2436* (2013.01); *H01L 45/08* (2013.01); *H01L 45/16* (2013.01)

(58) Field of Classification Search
  CPC .................................................. H10N 70/00
  See application file for complete search history.

(56) References Cited

U.S. PATENT DOCUMENTS

| | | | |
|---|---|---|---|
| 8,431,921 B2 | 4/2013 | Pickett et al. | |
| 9,431,609 B2 | 8/2016 | Dang et al. | |
| 2017/0141300 A1 | 5/2017 | Trinh et al. | |

*Primary Examiner* — Marvin Payen
(74) *Attorney, Agent, or Firm* — Viering Jentschura & Partner mbB

(57) ABSTRACT

According to various embodiments, there is provided a memory cell. The memory cell may include a transistor, a dielectric member, an electrode and a contact member. The dielectric member may be disposed over the transistor. The electrode may be disposed over the dielectric member. The contact member has a first end and a second end opposite to the first end. The first end is disposed towards the transistor, and the second end is disposed towards the dielectric member. The contact member has a side surface extending from the first end to the second end. The second end may have a recessed end surface that has a section that slopes towards the side surface so as to form a tip with the side surface at the second end. The dielectric member may be disposed over the second end of the contact member and may include at least a portion disposed over the tip.

20 Claims, 9 Drawing Sheets

MEMORY CELLS AND METHODS FOR FORMING MEMORY CELLS

TECHNICAL FIELD

Various embodiments relate to memory cells, in particular, resistive random-access memory (RRAM) cells, and methods of fabricating memory cells.

BACKGROUND

In contrast to conventional charge trapping memories, such as static random-access memory (SRAM), RRAM cells store data by resistive switching. A RRAM cell typically includes a memristor connected to a transistor. The memristor may include a switching layer sandwiched between a top electrode and a bottom electrode. The transistor controls the electrical field applied to the memristor through the top and bottom electrodes, for changing the electrical resistance of the switching layer between a high resistive state corresponding to a first logic value, for example "0", and a low resistive state corresponding to a second logic value, for example "1". RRAM cells have emerged as a promising candidate as the dominant next generation electronic data storage, due to its advantages over other competing memory technologies. Its advantages include high switching speed, scalability, easy fabrication and compatibility with complementary metal-oxide-semiconductor (CMOS) processes.

SUMMARY

According to various embodiments, there may be provided a memory cell. The memory cell may include a transistor, a dielectric member, an electrode and a contact member. The dielectric member may be disposed over the transistor. The electrode may be disposed over the dielectric member. The contact member may have a first end and a second end opposite to the first end, the first end disposed towards the transistor, and the second end disposed towards the dielectric member. The contact member may have a side surface extending from the first end to the second end. The second end may have a recessed end surface that has a section that slopes towards the side surface so as to form a tip with the side surface at the second end. The dielectric member may be disposed over the second end of the contact member and may include at least a portion disposed over the tip.

According to various embodiments, there may be provided a method for forming a memory cell. The method may include: forming a transistor, forming a dielectric member over the transistor, forming an electrode over the dielectric member, and forming a contact member. The contact member may have a first end and a second end opposite to the first end, the first end disposed towards the transistor and the second end disposed towards the dielectric member. The contact member may have a side surface extending from the first end to the second end, the second end having a recessed end surface, the recessed end surface having a section that slopes towards the side surface so as to form a tip with the side surface at the second end. The dielectric member may be disposed over the second end of the contact member and may include at least a portion disposed over the tip.

Additional features for advantageous embodiments are provided in the dependent claims.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Figure 1A:
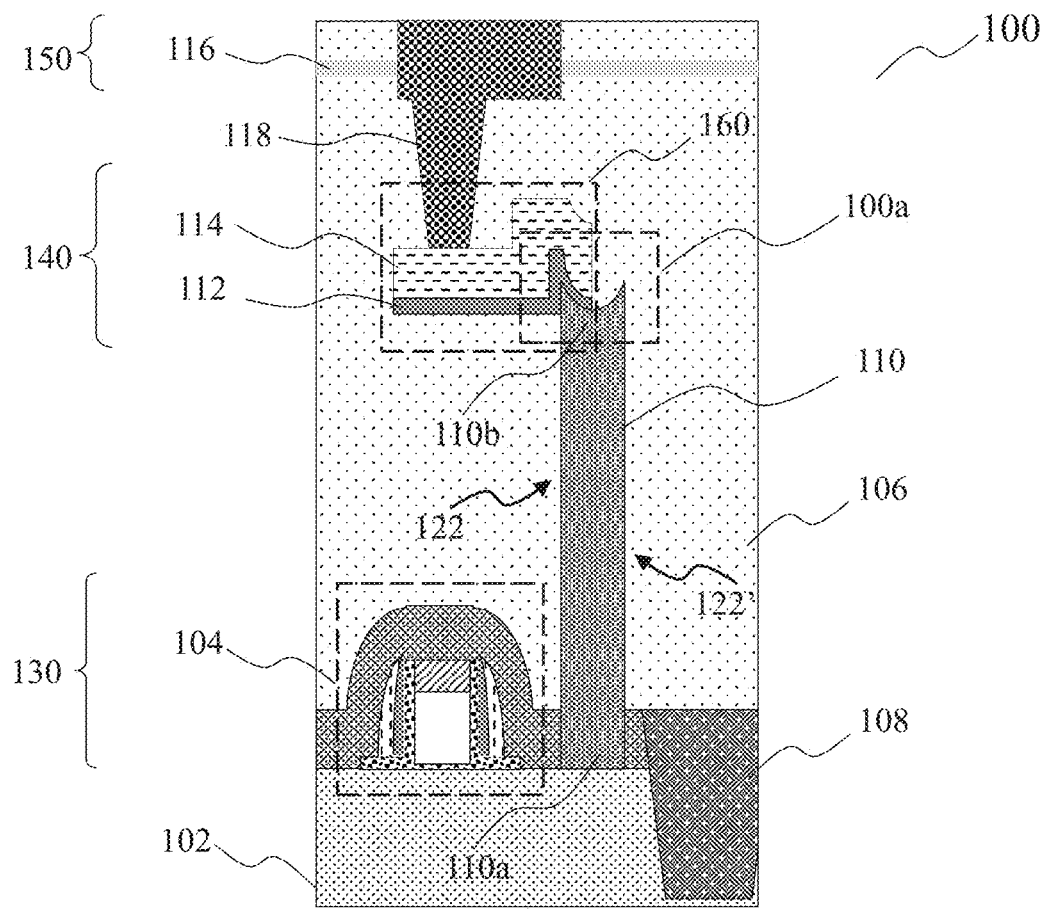
FIGS. 1A and 1B show simplified cross-sectional views of a memory cell according to various non-limiting embodiments.

The embodiments generally relate to memory cells. More particularly, some embodiments relate to resistive random access memory (RRAM), a form of nonvolatile storage that operates by changing the resistance of a specially formulated solid dielectric material. Existing methods for integrating RRAM into the semiconductor devices require multiple etching masks. Some embodiments relate to RRAM that may be integrated into semiconductor devices with a reduced number of etching masks in the manufacturing process. The memory cell may be embedded with the contact member of the semiconductor device. The contact member may be an electrical connection between a front-end-of-line (FEOL) device and back-end-of-line (BEOL) metal in a semiconductor device.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Figure 1B:
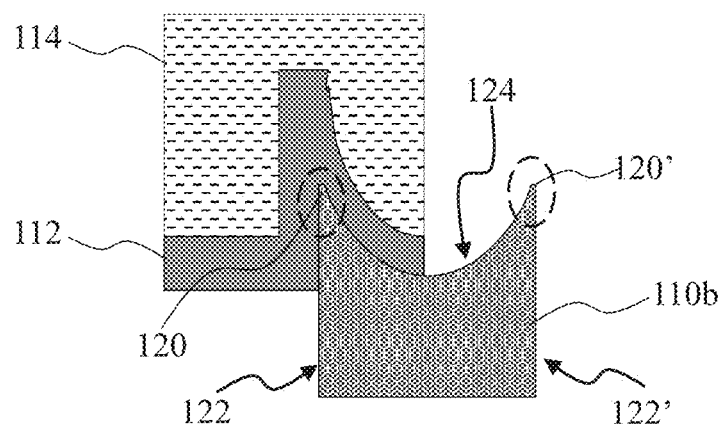

FIGS. 1A and 1B show simplified cross-sectional views of a memory cell 100 according to various non-limiting embodiments.

As shown in FIG. 1A, the memory cell 100 may include a transistor 104, a contact member 110, a dielectric member 112, and an electrode 114. The transistor 104 may be formed in a layer 130 of the memory cell 100. The dielectric member 112 and the electrode 114 may be formed in another layer 140 of the memory cell. The electrode 114 may be disposed over the dielectric member 112. The layer 140 may be disposed over the layer 130. In other words, the dielectric member 112 and the electrode 114 may be formed over the transistor 104. The contact member 110 has a first end 110a and a second end 110b that is opposite to the first end 110a. The contact member 110 may extend vertically from the layer 130 to the layer 140. The contact member 110 may be provided between the dielectric member 112 and the transistor 104, with its first end 110a disposed towards the transistor 104 and its second end 110b disposed towards the dielectric member 112. The contact member 110 also has a side surface 122 extending from the first end 110a to the second end 110b. The contact member 110 may also have another side surface 122' opposite to the side surface 122.

The side surface 122' may similarly extend from the first end 110a to the second end 110b. The second end 110b of the contact member 110 may be coupled to the dielectric member 112. The coupling between the contact member 110 and the dielectric member 112 may be described further with respect to FIG. 1B.

The transistor 104 may be a conventional transistor and as such, is not described in details herein. The transistor 104 may be a field effect transistor (FET), such as a metal-oxide-semiconductor field effect transistor (MOSFET). The transistor 104 may have a gate, a source region and a drain region.

The memory cell 100 may further include a substrate 102. The layer 130 may be formed on the substrate 102. The transistor 104 may be disposed on the substrate 102. The substrate 102 may include a semiconductor, such as silicon. The memory cell 100 may be electrically isolated from another memory cell 100 by a trench isolation structure 108. The trench isolation structure 108 may be disposed in the substrate 102 and may be adjacent to the contact member 110. The trench isolation structure 108 may be a deep trench isolation (DTI).

The contact member 110 may include an electrically conductive material, for example, a metal, such as tungsten. The first end 110a of the contact member 110 may be electrically coupled to the transistor 104, for example, connected to the source region or drain region of the transistor 104. When the transistor 104 is turned on, an electrical current may flow between the source region and the drain region. The second end 110b of the contact member 110 may be electrically coupled to the dielectric member 112. The dielectric member 112 may have a top surface and a bottom surface opposite to the top surface. The contact member 110 may contact the dielectric member 112 at the bottom surface of the dielectric member 112. The contact member 110 may carry the electrical current from the transistor 104 to the dielectric member 112. In other words, the contact member 110 may electrically connect the dielectric member 112 to the transistor 104.

The electrode 114 may include an electrically conductive material, such as a metal, for example tantalum or platinum, or combinations thereof. The dielectric member 112 may include a high-k dielectric material. The dielectric member 112 may include a metal oxide, for example, aluminum oxide, titanium oxide, hafnium oxide, or combinations thereof. The dielectric member 112 may include a memory switching layer. The electrode 114 may contact the dielectric member 112 at the top surface of the dielectric member 112. The dielectric member 112 may be arranged between the electrode 114 and the second end 110b of the contact member 110. The electrode 114 and the contact member 110 may be configured to apply an electric field across the dielectric member 112. The application of an electric field across the dielectric member 112 may change the resistance of the dielectric member. The electrode 114, the dielectric member 112 and the contact member 110 may collectively form a memristor 160. In other words, the electrode 114, the dielectric member 112 and the contact member 110 may include a memristor 160. The dielectric member 112 may function as the switching layer of the memristor 160. The electrode 114 may function as the upper electrode of the memristor 160. The contact member 110 may function as the bottom electrode of the memristor 160. The data stored in the memory cell 100 may be changed, i.e. switched, by applying an electric field across the dielectric member 112 via the electrode 114 and the contact member 110 to change the resistance of the dielectric member 112. In embodiments where both the electrode 114 and the contact member 110 are formed from metals, the memristor 160 may be referred to as a metal-insulator-metal (MIM) capacitor.

The memory cell 100 may further include another layer 150 disposed over the layer 140. The layer 150 may include a metallization layer 116. The metallization layer 116 may include, for example, tantalum. The memory cell may further include an upper via 118. The upper via 118 may include a conductive material, for example, a metal, such as platinum, tantalum, or combinations thereof. The upper via 118 may extend from the layer 140 to the layer 150. The upper via 118 may contact the electrode 114, to electrically connect the memristor 160 to the metallization layer 116.

The memory cell 100 may further include an insulator material 106 between the layer 130 and the layer 140, as well as between the layer 140 and the layer 150. The insulator material 106 may surround a portion of the contact member 110 lying between the transistor 104 and the dielectric member 112. The insulator material 106 may be part of the inter-layer dielectric (ILD) in between different layers. The insulator material 106 may include, for example, tetraethyl orthosilicate (TEOS).

FIG. 1B shows a magnified view of a portion 100a of the memory cell 100. The second end 110b of the contact member 110 may have a depression formed in it. As a result, the second end 110b may have a recessed end surface 124. The recessed end surface 124, in some embodiments, may have a concave cross-sectional profile. The recessed end surface 124 may form a tip 120 with the side surface 122. The recessed end surface 124 may have a section that slopes towards the side surface 122 so as to form the tip 120 with the side surface 122 at the second end 110b. The recessed end surface 124 may also form another tip 120' with the other side surface 122'. The recessed end surface 124 may have another section that slopes towards the side surface 122' so as to form the tip 120' with the side surface 122'.

The tips 120 and 120' may be relatively sharp as compared to the rest of the contact member 110. The dielectric member 112 may be disposed over the second end 110b. The dielectric member 112 may include a portion disposed over the tip 120. In other words, a portion of the dielectric member 112 may overlie the tip 120. The dielectric member 112 may contact part of the recessed end surface 124, for example only half of the recessed end surface 124 like shown in FIG. 1B. The dielectric member 112 may also contact part of the side surface 122 at the second end 110b of the contact member 110. The dielectric member 112 may extend laterally from the side surface 122 at the second end 110b of the contact member 110. The electrode 114 may be provided on the dielectric member 112. The electrode 114 may have the same width as the dielectric member 112, for example, in embodiments where the dielectric member 112 contacts only half of the recessed end surface 124, the electrode 114 may also be disposed over, but separated by the dielectric member 112, half of the recessed end surface 124. The dielectric member 112 may be conformal to half of the recessed end surface 124.

While FIG. 1A shows the dielectric member 112 extending laterally from the side surface 122, in alternative embodiments, the dielectric member 112 may extend laterally from the side surface 122' instead. The electrode 114 may be disposed over the trench isolation structure 108.

The width of the contact member 110 may be defined as a distance between the tips 120 and 120'. The height of the contact member 110 may be defined as a distance between the first end 110a and the second end 110b. The depth of the contact member 110 may be perpendicular to each of the width and height of the contact member 110. Each of the tips 120, 120' may be elongated along a depthwise direction of the contact member 110, such that each of the tips 120, 120' may be shaped like a ridge.

According to various embodiments, the contact member 110 may be cylindrical in shape. In these embodiments, the side surface 122 and the other side surface 122' may be different regions of the circumferential side surface of the contact member 110. Each of the tips 120, 120' may be an arc-shaped ridge.

Figure 2A:
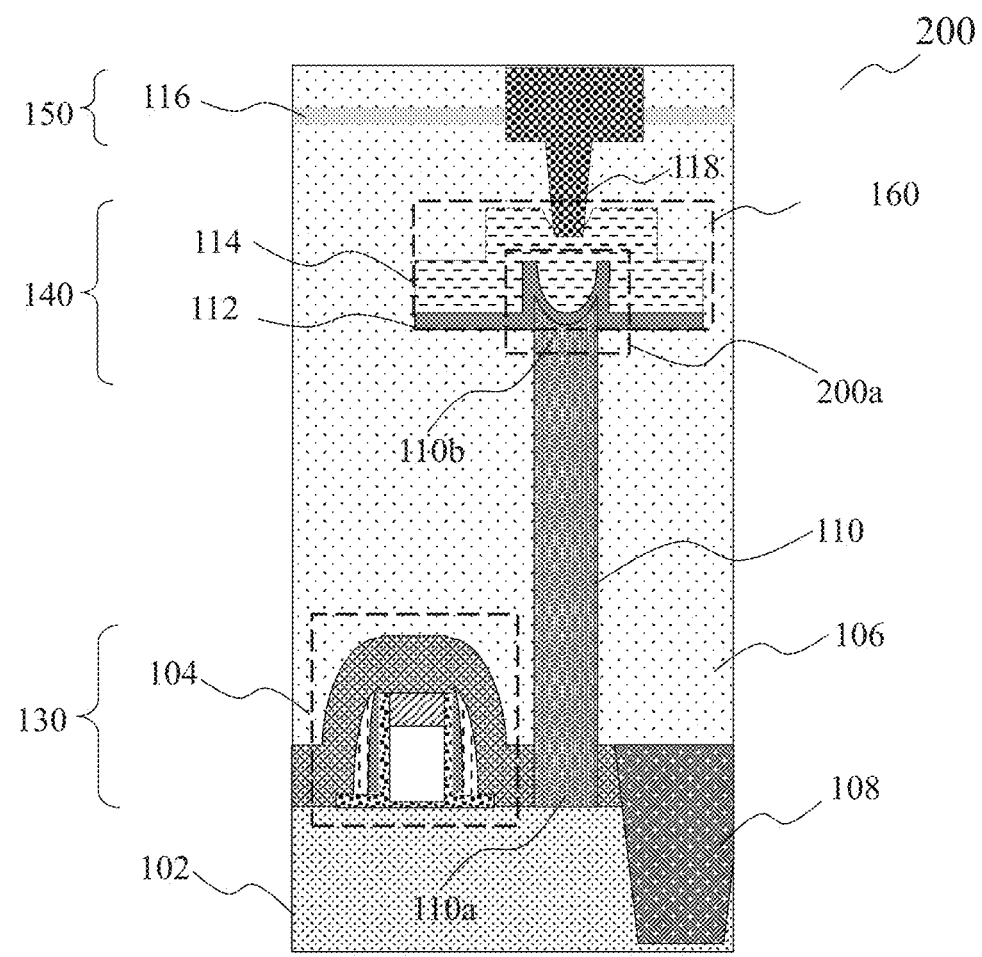
FIGS. 2A and 2B show simplified cross-sectional views of a memory cell according to various non-limiting embodiments.
Figure 2B:
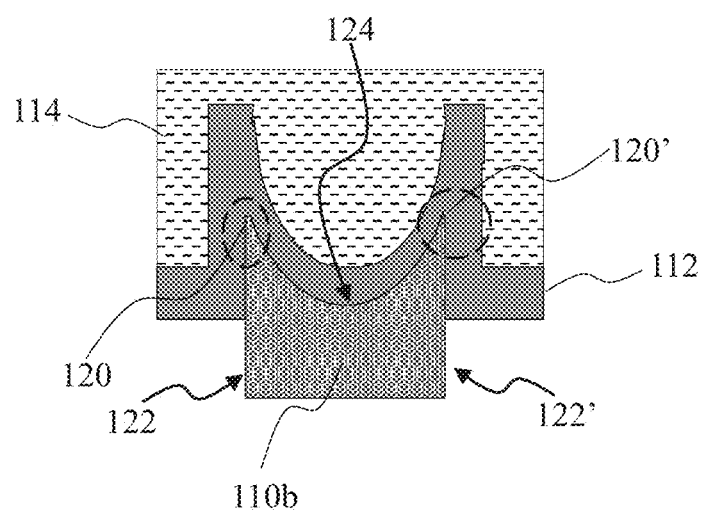

FIGS. 2A and 2B show simplified cross-sectional views of a memory cell 200 according to various non-limiting embodiments.

Referring to FIG. 2A, like the memory cell 100, the memory cell 200 may also include a transistor 104, a contact member 110, a dielectric member 112, and an electrode 114. The memory cell 200 may also include a substrate 102, a trench isolation structure 108, an insulation material 106, a metallization layer 116, and an upper via 118. Also, like in the memory cell 100, the contact member 110 of the memory cell 200 similarly has a recessed end surface 124 at its second end 110b that faces the dielectric member 112. For brevity, common components between the memory cell 100 and the memory cell 200 are not discussed herein. The memory cell 200 may differ from the memory cell 100, in the structure of the dielectric member 112 and the electrode 114.

FIG. 2B shows a magnified view of a portion 200a of the memory cell 200. The dielectric member 112 may be disposed over an entire area of the recessed end surface 124. The dielectric member 112 may include a portion disposed over the tip 120 and another portion disposed over the tip 120'. The dielectric member 112 may also contact part of the side surface 122 and part of the side surface 122' at the second end 110b of the contact member 110. The dielectric member 112 may extend laterally from the side surface 122 at the second end 110b of the contact member 110, and also extend laterally from the side surface 122' at the second end 110b of the contact member 110. The dielectric member 112 may be conformal to the recessed end surface 124. The electrode 114 may have the same width as the dielectric member 112. At least part of the electrode 114 may be formed conformal to the recessed end surface 124, although it may be separated from the recessed end surface 124 by the dielectric member 112.

Referring to both FIGS. 1B and 2B, in both the memory cells 100 and 200, the contact member 110 performs two roles in the memory cell—the first role being an electrical connection between the transistor 104 and the memristor 160; the second role being the bottom electrode of the memristor 160. By having the contact member 110 perform dual-roles instead of fabricating a single-purpose contact and a separate single-purpose bottom electrode, the manufacturing process of the memory cells 100 and 200 may require less etch masks. For example, as the contact member 110 also serves as the bottom electrode of the memristor 160, the process of forming the memristor 160 does not require an additional mask for the bottom electrode. Further, the tip 120 at the second end 110b of the contact member 110 may serve as an alignment marker. As such, a separate alignment mask may not be required for forming the logic area 330.

Figure 2C:
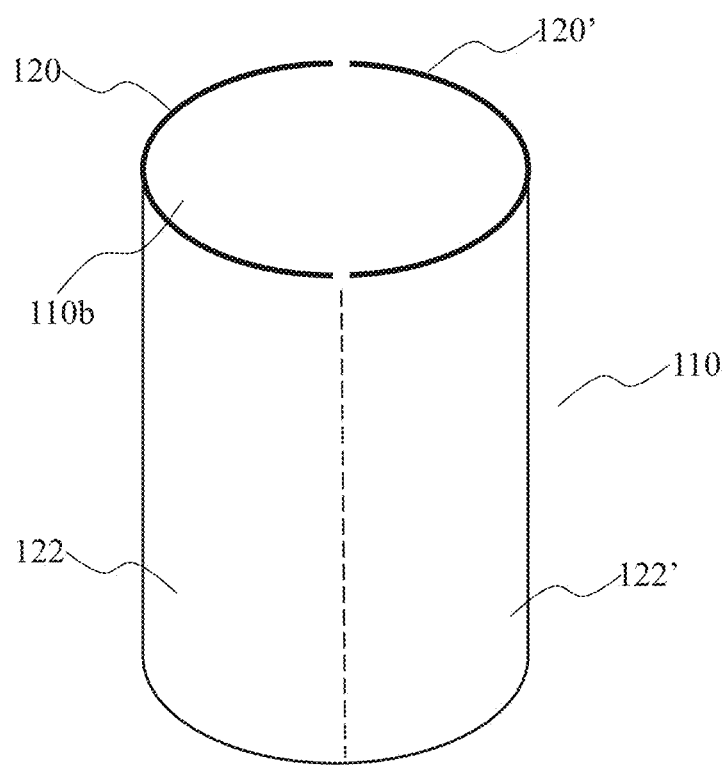
FIG. 2C shows a perspective view of the contact member 110 according to various embodiments.

FIG. 2C shows a perspective view of the contact member 110 according to various embodiments. The contact member 110 may be cylindrical in shape. The side surface 122 and the other side surface 122' may be different regions of the circumferential side surface of the contact member 110.

Each of the tips 120, 120' may be an arc-shaped ridge. Each of the tips 120, 120' may include a half a circumference of the second end 110b. In the memory cell 100, the dielectric member 112 may contact only half of the recessed end surface 124, and may contact only one of the tips 120 or 120'. In the memory cell 200, the dielectric member 112 may contact both the tips 120 and 120'. The tip 120 or 120', which is sharper in profile as compared to the rest of the second end 110b, may create a local enhancement effect above the second end 110b of the contact member 110, such that the electric field at the tip 120 or 120' may be much higher than if the same potential difference is applied across a flat electrode. In comparison, the memory cell 100 may have a stronger local enhancement effect than the memory cell 200, as the electric field is focused within an arc-shaped ridge that spans half of the circumference of the second end 110b, i.e. the tip 120, instead of being focused in two ridges that, combined, span the entire circumference of the second end 110b, i.e. in both the two tips 120 and 120'. In other words, in the memory cell 100, the electric field is focused at half the area as compared to that in the memory cell 200.

FIGS. 3A to 3H show simplified cross-sectional views illustrating a method for fabricating the memory cell 100 according to various non-limiting embodiments. For clarity of illustration, some reference numerals are omitted from FIGS. 3A to 3H.

Figure 3A:
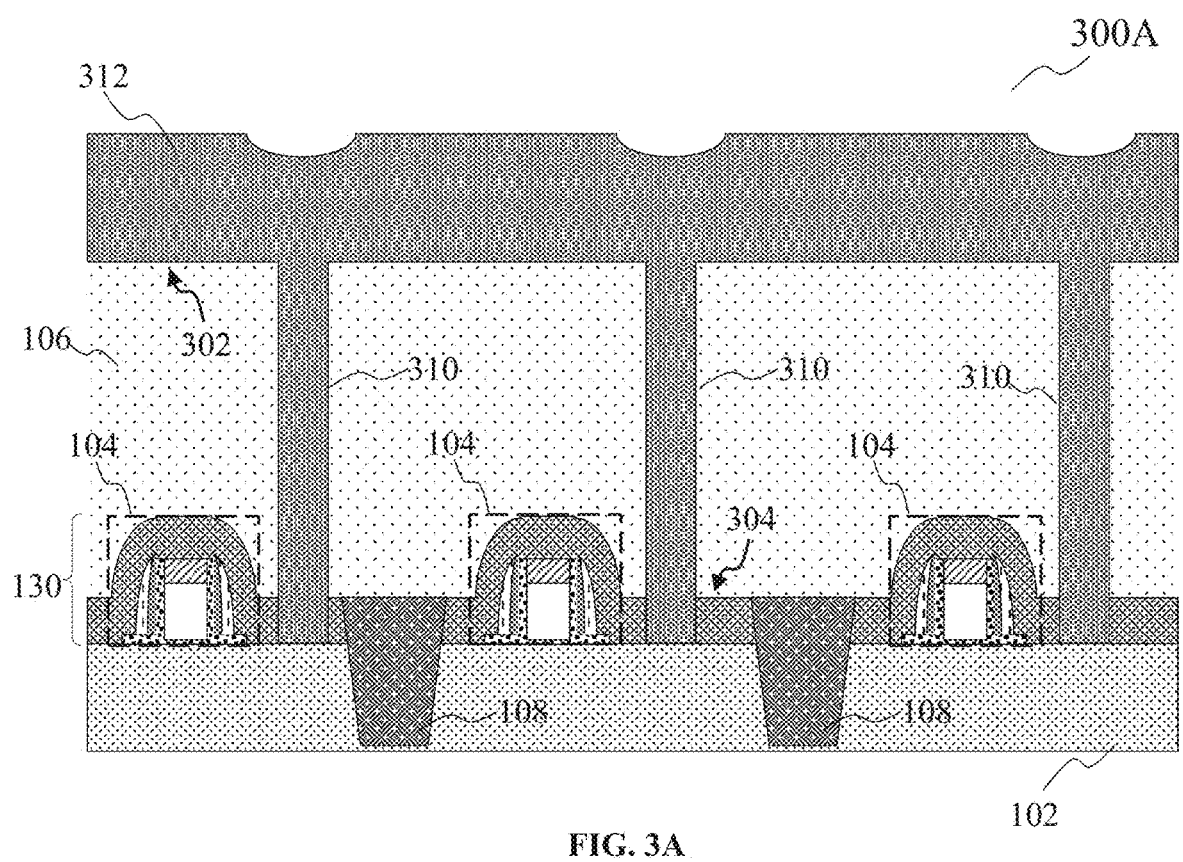
FIGS. 3A to 3H show simplified cross-sectional views illustrating a method for fabricating the memory cell of FIGS. 1A-1B according to various non-limiting embodiments.

FIG. 3A shows a process 300A. The process 300A may include providing a semiconductor structure including a substrate 102, and a layer 130 that includes a plurality of transistors 104. The semiconductor structure may further include a plurality of trench isolation structures 108 disposed partially in the substrate 102. Each trench isolation structured 108 may be provided between each two neighboring transistors 104. The semiconductor structure may further include an insulator material 106 provided over the transistors 104 and the trench isolation structures 108. The process 300A may include forming a plurality of cavities in the insulator material 106 and the layer 130. Each cavity may extend vertically from an upper surface 302 of the insulator material to a lower surface 304 of the insulator material 106, through to the layer 130. The process 300A may further include depositing a metal 312 over the upper surface 302 of the insulator material 106 and into the cavities. The deposited metal 312 may completely fill up each cavity to form a pillar 310 in each cavity. The deposited metal 312 may include tungsten.

Figure 3B:
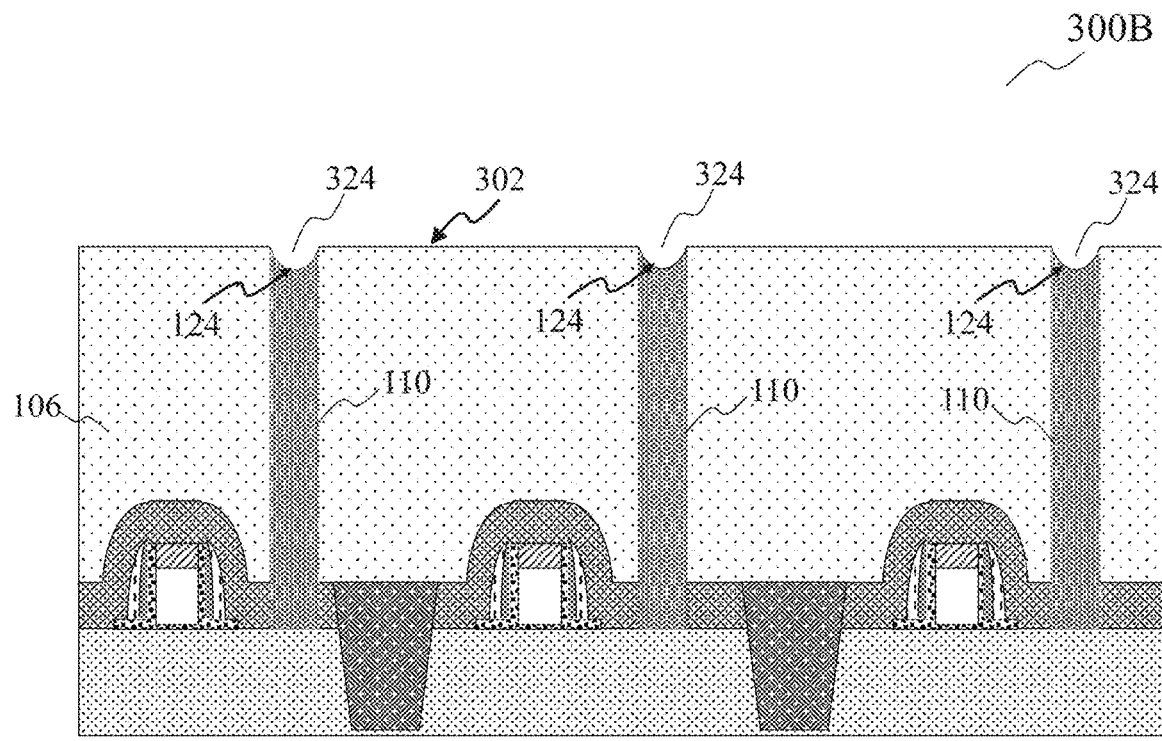

FIG. 3B shows a process 300B. The process 300B may include removing the deposited metal 312 on the upper surface 302 of the insulator material 106, from the semiconductor structure resulting from the process 300A. The deposited metal 312 on the upper surface 302 may be removed by a planarization process, such as chemical mechanical polishing (CMP), until the underlying upper surface 302 of the insulator material 106 is revealed. The process 300B may include continuing the CMP process, so that a small amount of the metal is removed from the exposed end of each pillar 310, to form a recess 324, i.e. a depression, at the exposed end. Consequently, each pillar 310 may have a recessed end surface 124 at the exposed end, also referred herein as the second end 110b. The resultant pillars 310 are referred herein as the contact members 110.

Figure 3C:
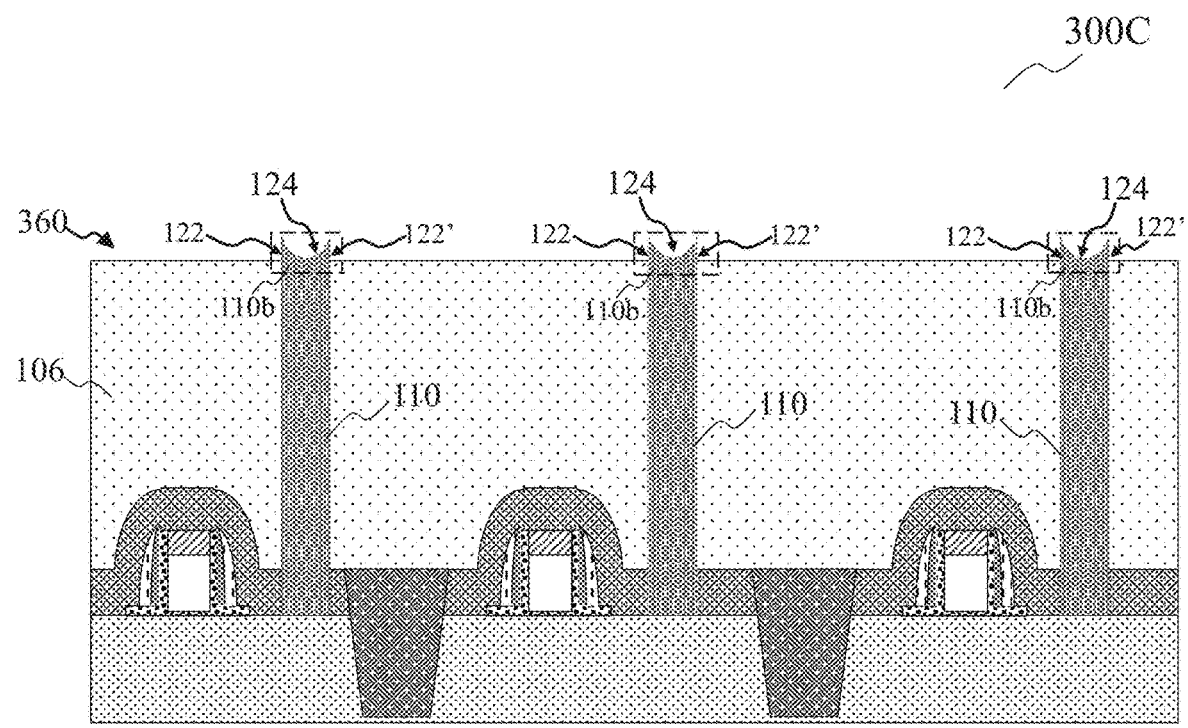

FIG. 3C shows a process 300C. The process 300C may include removing the insulator material 106 around the second end 110b of each contact member 110, to expose the side surfaces 122, 122' at the second end 110b. The process 300C may remove a portion of the insulator material 106 so that a resulting top surface 360 of the insulator material 106 may be at a same level, or lower, than the depth of the recess 324. The insulator material 106 may be removed by etching. In various embodiments, the height of the insulator material 106 may be reduced by about 200 nm.

Figure 3D:
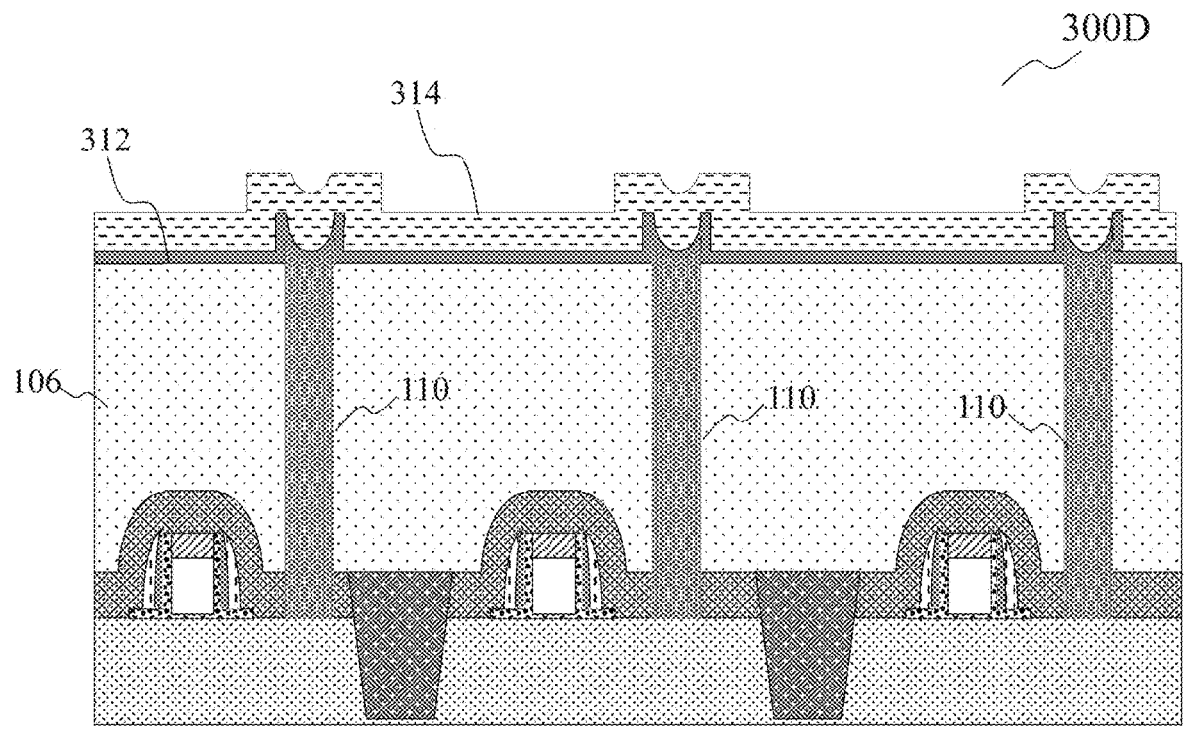

FIG. 3D shows a process 300D. The process 300D may include depositing a layer of dielectric material 312 over the remaining insulator material 106 and the respective second ends 110b of the contact members 110, of the semiconductor structure resulting from the process 300C. The layer of dielectric material 312 may conform to the upper surface of the remaining insulator material 106 and the recessed end surface of the contact members 110. The dielectric material 312 may form a switching layer of a memory cell. The process 300D may further include depositing an electrode material 314 over the layer of deposited dielectric material 312. The layer of electrode material 314 may conform to the shape of the deposited dielectric material 312.

Figure 3E:
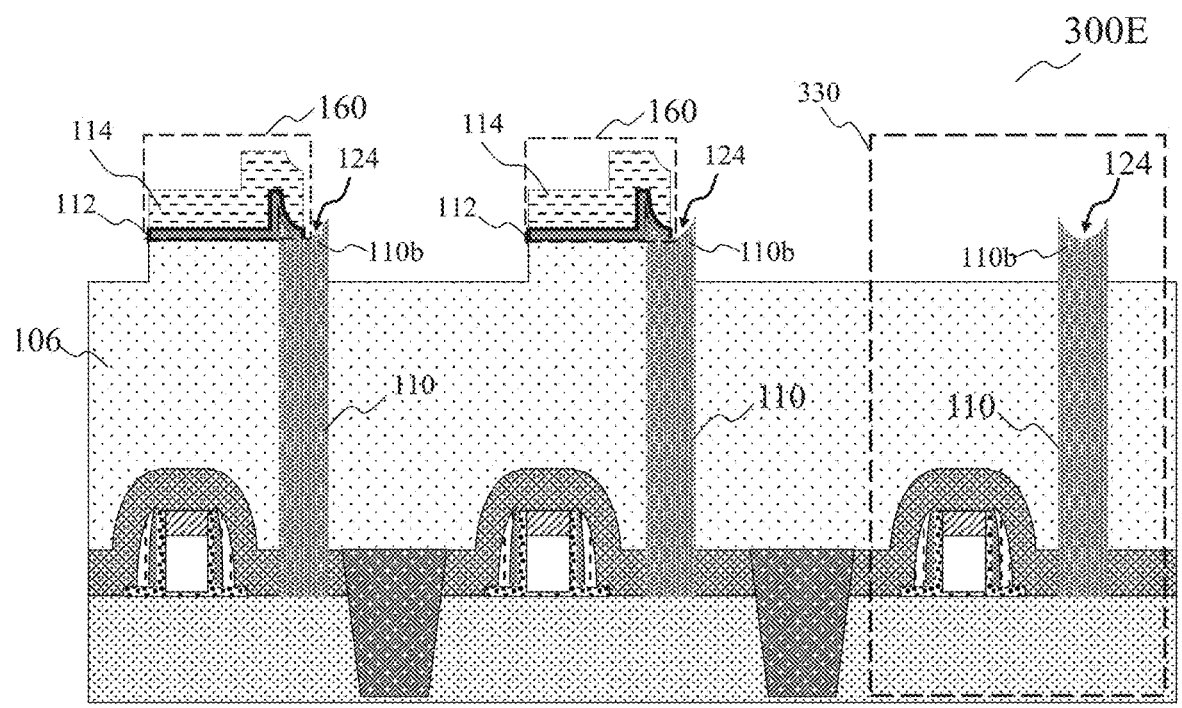

FIG. 3E shows a process 300E. The process 300E may include removing part of the insulator material 106, the dielectric material 312 and the electrode material 314. The process 300E may result in the dielectric member 112 and the electrode 114 being formed. The process 300E may include forming a mask, for example by lithography, to define areas of the semiconductor structure resulting from the process 300D, that will become the memristor 160. The mask may protect the defined areas from being etched. The dielectric material 312 and the electrode material 314 may be entirely removed in a logic area 330 of the semiconductor structure. The dielectric material 312 and the electrode material 314 overlying half of the recessed end surface 124 may be removed, so that the remaining dielectric material 312 and electrode material 314 only covers half of the recessed end surface. The dielectric material 312 and the electrode material 314 overlying regions in between neighboring contact members 110 may also be removed. The remaining dielectric material 312 may be the dielectric members 112. The remaining electrode material 314 may be the electrodes 114. The layer 140 may be formed in the process 300E.

Figure 3F:
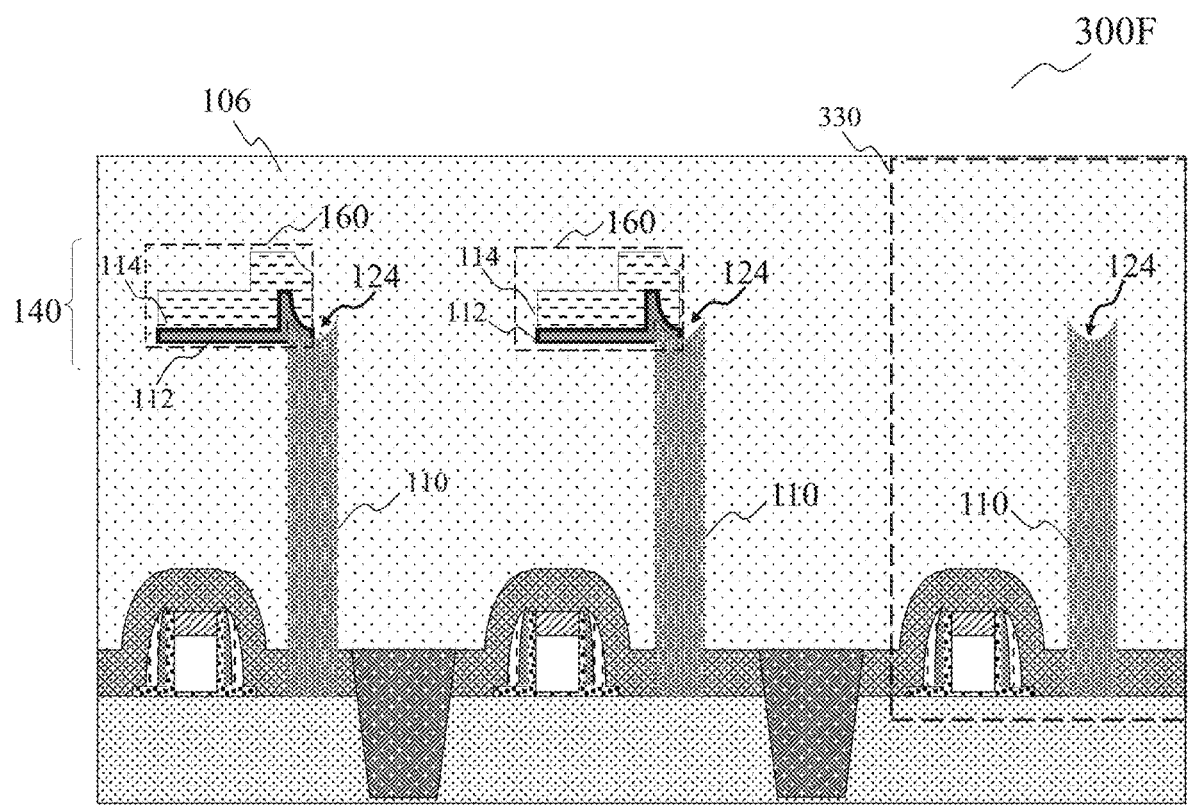

FIG. 3F shows a process 300F. The process 300F may include depositing additional insulator material 106 over the semiconductor structure resulting from the process 300E. The additional insulator material 106 may be deposited over the previously remaining insulator material 106, the remaining exposed area of the recessed end surfaces 124 and the electrodes 114. The process 300F may further include planarizing the deposited additional insulator material 106.

Figure 3G:
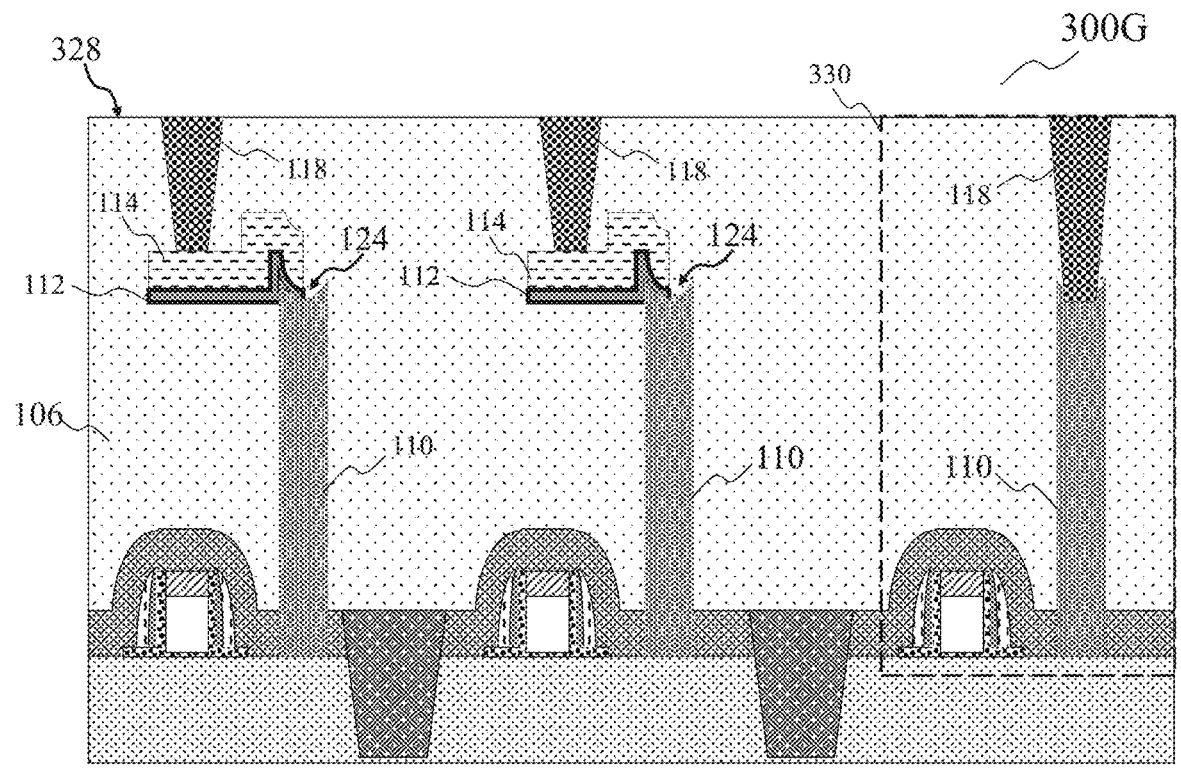

FIG. 3G shows a process 300G. The process 300G may include forming openings in the insulator material 106 that extend from an upper surface 328 of the insulator material 106 to the electrodes 114, as well as openings that extend from the upper surface 328 to the contact members 110 in the logic area 330. The process 300G may further include depositing a conductive material, such as a metal into these openings. As a result of the deposition of the conductive material, an upper via 118 may be formed over each electrode 114. In the logic area 330, the upper via 118 is formed directly on the contact member 110. The upper vias 118 may connect the electrodes 114 to a metallization layer which will be formed in the process 300H.

Figure 3H:
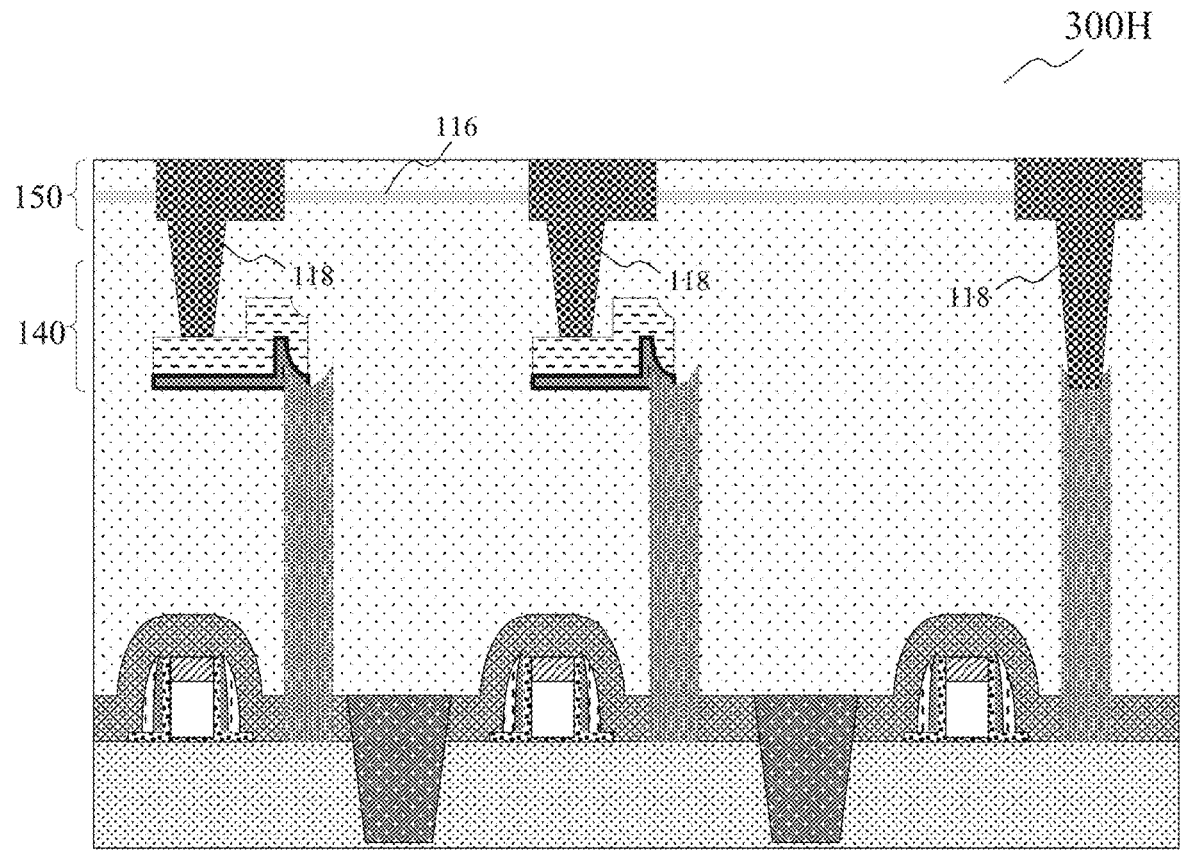

FIG. 3H shows a process 300H. The process 300H may include forming the metallization layer 116 over the upper vias 118 and the insulator material 106. The metallization layer 116 may be arranged over the layer 140. The metallization layer 116 may be formed by depositing a metal over the insulator material 106 and the upper vias 118, and patterning the deposited metal. The layer 150 may be formed in the process 300H.

FIGS. 4A to 4D show simplified cross-sectional views illustrating a method for fabricating the memory cell 200 according to various non-limiting embodiments. For clarity of illustration, some reference numerals are omitted from FIGS. 4A to 4D. The method may include processes 300A to 300D, which are not repeated here for brevity.

Figure 4A:
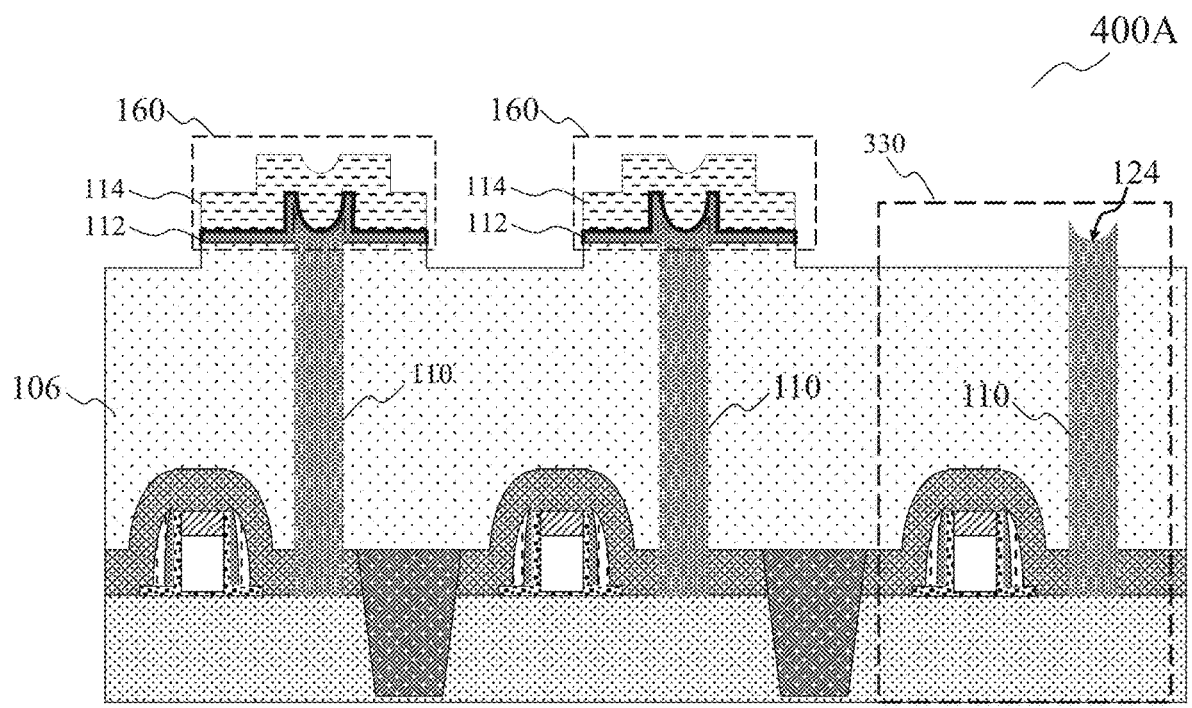
FIGS. 4A to 4D show simplified cross-sectional views illustrating a method for fabricating the memory cell of FIGS. 2A-2B according to various non-limiting embodiments.

FIG. 4A shows a process 400A. The process 400A may include removing part of the insulator material 106, the dielectric material 312 and the electrode material 314, from the semiconductor structure resulting from the process 300D. The process 400A may be an alternative process to the process 300E.

The process 400A may result in the dielectric member 112 and the electrode 114 being formed. The process 400A may include forming a mask, for example by lithography, to define areas that will become the memristor 160. The mask may protect the defined areas from being etched. The dielectric material 312 and the electrode material 314 may be entirely removed in a logic area 330 of the semiconductor structure. The dielectric material 312 and the electrode material 314 overlying regions in between neighboring contact members 110 may be removed. The dielectric material 312 and the electrode material 314 overlying the recessed end surface 124 may be retained, so that the remaining dielectric material 312 and electrode material 314 covers the entirety of the recessed end surfaces 124 and the two tips 120, 120'. The remaining dielectric material 312 may be the dielectric members 112. The remaining electrode material 314 may be the electrodes 114. The layer 140 may be formed in the process 400A.

Figure 4B:
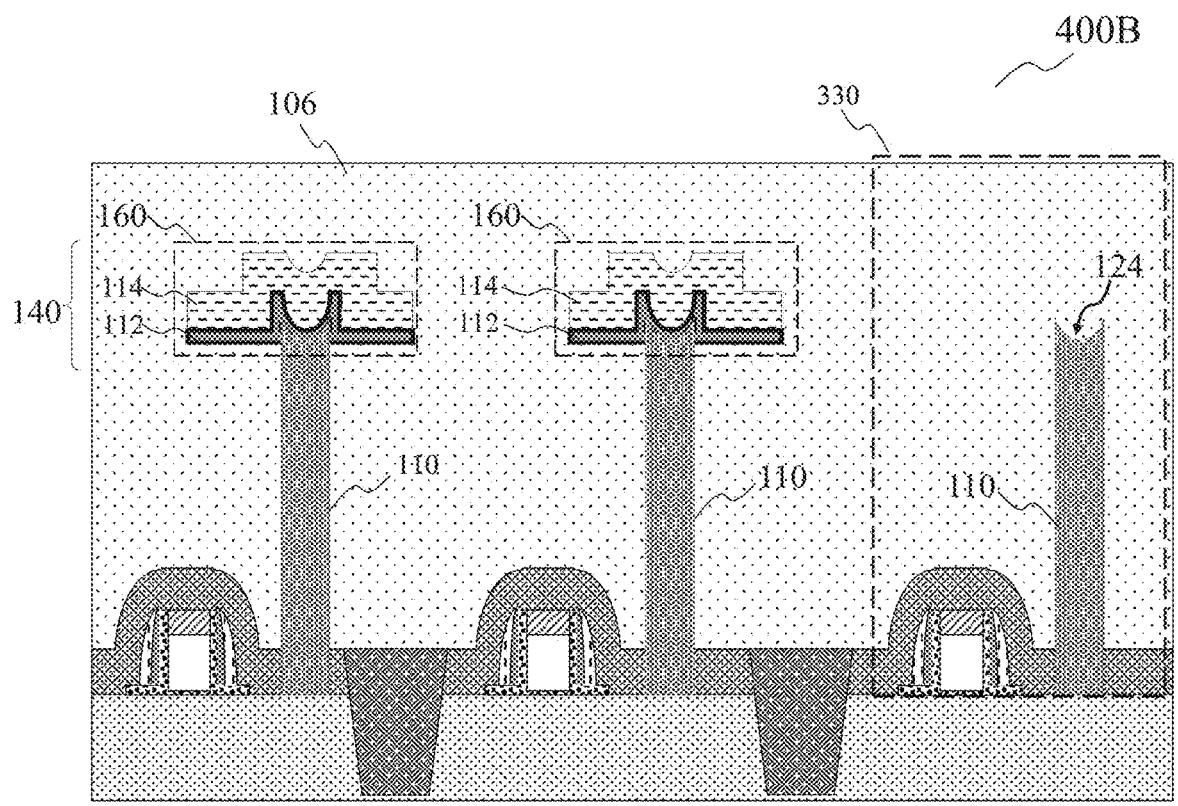

FIG. 4B shows a process 400B. The process 400B may be similar to the process 300F. The process 400B may include depositing additional insulator material 106 over the semiconductor structure resulting from the process 400A. The additional insulator material 106 may be deposited over the previously remaining insulator material 106, the electrodes 114 and the recessed end surface 124 in the logic area 330. The process 400B may further include planarizing the deposited additional insulator material 106.

Figure 4C:
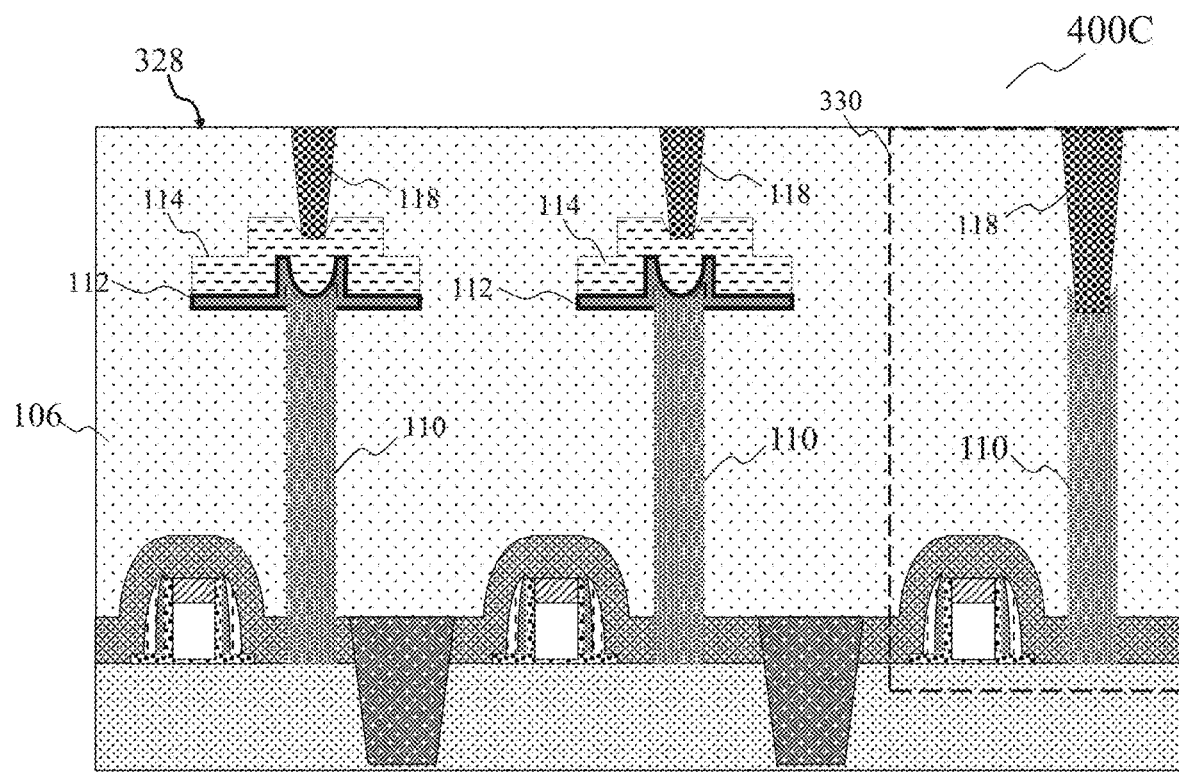

FIG. 4C shows a process 400C. The process 400C may be similar to the process 300G. The process 400C may include forming openings in the insulator material 106 that extend from an upper surface 328 of the insulator material 106 to the electrodes 114, as well as openings that extend from the upper surface 328 to the contact member 110 in the logic area 330. The process 400C may further include depositing a conductive material, such as a metal into these openings. As a result of the deposition of the conductive material, an upper via 118 may be formed over each electrode 114. While the figure shows the upper vias 118 formed over the recessed end surface 124, the upper vias 118 need not be vertically aligned with the recessed end surface 124 and may be offset from the recessed end surface 124.

In the logic area 330, the upper via 118 may be formed directly on the contact member 110. The upper vias 118 may connect the electrodes 114 to a metallization layer which will be formed in the process 400D.

Figure 4D:
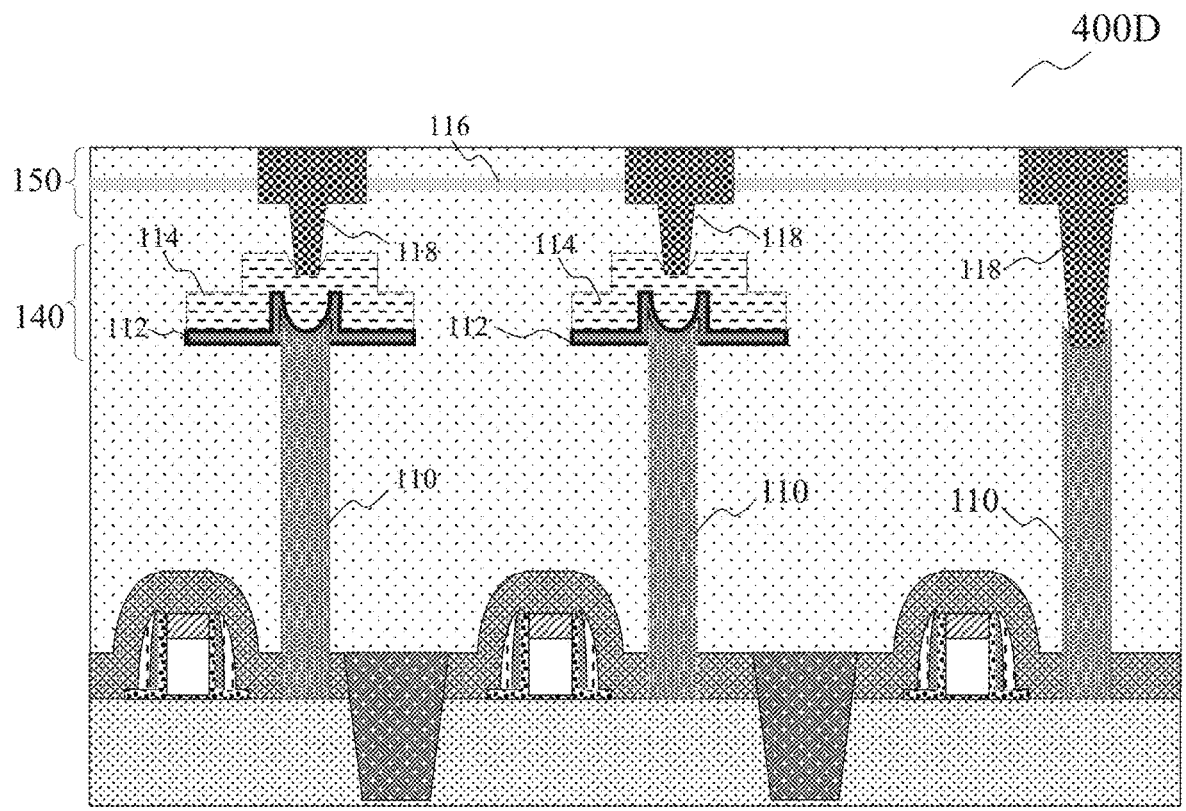

FIG. 4D shows a process 400D. The process 400D may be similar to the process 300H. The process 400D may include forming the metallization layer 116 over the upper vias 118 and the insulator material 106. The metallization layer 116 may be arranged over the layer 140. The metallization layer 116 may be formed by depositing a metal over the insulator material 106 and the upper vias 118, and patterning the deposited metal. The layer 150 may be formed in the process 400D.

According to various non-limiting embodiments, a method for forming a memory cell may include forming the transistor 104, forming the dielectric member 112 over the transistor 104, forming the electrode 114 over the dielectric member, and forming the contact member 110. The method may include at least one or more of the processes 300A to 300D. The method may include at least one or more of the processes 300E to 300H or one or more of the processes 400A to 400D.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A memory cell comprising:
  a transistor;
  a dielectric member disposed over the transistor;
  an electrode disposed over the dielectric member; and
  a contact member having a first end and a second end opposite the first end, the first end disposed towards the transistor and the second end disposed towards the dielectric member, wherein the contact member has a side surface extending from the first end to the second end, the second end having a recessed end surface, the recessed end surface having a section that slopes towards the side surface so as to form a tip with the side surface at the second end,
  wherein the dielectric member is disposed over the second end of the contact member and comprises at least a portion disposed over the tip.

2. The memory cell of claim 1, wherein the electrode and the contact member are configured to apply an electric field across the dielectric member, for changing a resistance of the dielectric member.

3. The memory cell of claim 1, wherein the first end of the contact member is electrically coupled to the transistor.

4. The memory cell of claim 1, wherein the contact member electrically connects the dielectric member to the transistor.

5. The memory cell of claim 1, wherein the contact member further comprises another side surface extending from the first end to the second end, the recessed end surface having another section that slopes towards the another side surface so as to form another tip with the another side surface at the second end, wherein the dielectric member further comprises another portion disposed over the another tip.

6. The memory cell of claim 1, wherein the transistor is disposed in a first layer of the memory cell, wherein the dielectric member and the electrode are disposed in a second layer of the memory cell, wherein the contact member extends vertically from the first layer to the second layer.

7. The memory cell of claim 6, further comprising:
  an insulator material disposed between the first layer and the second layer.

8. The memory cell of claim 1, wherein the recessed end surface has a concave cross-sectional profile.

9. The memory cell of claim 1, wherein the dielectric member is disposed over an entire area of the recessed end surface.

10. The memory cell of claim 1, wherein the dielectric member is disposed over only half of the recessed end surface.

11. The memory cell of claim 1, wherein the contact member comprises a metal.

12. The memory cell of claim 1, wherein the electrode, the dielectric member, and the contact member comprises a memristor.

13. The memory cell of claim 1, wherein the dielectric member extends laterally from the side surface at the second end of the contact member.

14. A method for forming a memory cell, the method comprising:
   forming a transistor;
   forming a dielectric member over the transistor;
   forming an electrode over the dielectric member; and
   forming a contact member having a first end and a second end opposite to the first end, the first end disposed towards the transistor and the second end disposed towards the dielectric member, wherein the contact member has a side surface extending from the first end to the second end, the second end having a recessed end surface, the recessed end surface having a section that slopes towards the side surface so as to form a tip with the side surface at the second end;
   wherein the dielectric member is disposed over the second end of the contact member and comprises at least a portion disposed over the tip.

15. The method of claim 14, wherein forming the contact member comprises:
   forming a cavity in an insulator material and a layer comprising the transistor, wherein the cavity extends vertically from an upper surface of the insulator material to a lower surface of the insulator material through to the layer comprising the transistor,
   depositing a metal into the cavity, and
   performing chemical mechanical polishing on the deposited metal to form a recess at the second end of the contact member.

16. The method of claim 15, further comprising:
   removing the insulator material around the second end of the contact member to expose the side surface at the second end of the contact member.

17. The method of claim 16, wherein forming the dielectric member comprises:
   depositing a dielectric material over the remaining insulator material and the second end of the contact member.

18. The method of claim 17, wherein forming the electrode comprises:
   depositing an electrode material over the deposited dielectric material.

19. The method of claim 18, wherein forming the dielectric member and forming the electrode further comprises:
   removing the dielectric material and the electrode material overlying half of the recessed end surface.

20. The method of claim 14, further comprising:
   forming an upper via over the electrode, wherein the upper via connects the electrode to a metallization layer arranged above a layer comprising the dielectric member.

* * * * *